United States Patent [19]
Edwards

[11] Patent Number: 6,080,650
[45] Date of Patent: Jun. 27, 2000

[54] METHOD AND APPARATUS FOR ATTACHING PARTICLES TO A SUBSTRATE

[75] Inventor: Darvin R. Edwards, Garland, Tex.

[73] Assignee: Texas Instruments Incorporated, Dallas, Tex.

[21] Appl. No.: 09/235,003

[22] Filed: Jan. 20, 1999

[51] Int. Cl.[7] .................................................. H01L 21/44
[52] U.S. Cl. .......................................... 438/612; 438/618
[58] Field of Search ..................................... 438/612, 618

[56] References Cited

U.S. PATENT DOCUMENTS

| | | | |
|---|---|---|---|
| 4,996,078 | 2/1991 | Langowshi | 437/38 |
| 5,608,155 | 3/1997 | Ye et al. | 438/222 |
| 5,782,399 | 12/1995 | Lapastora | 228/41 |

*Primary Examiner*—Richard Elms
*Attorney, Agent, or Firm*—Gary C. Honeycutt

[57] ABSTRACT

A method for attaching particles (12) to a substrate (14), comprising the steps of transferring adhesive areas (30) from an adhesive stamp (35) to contact pads (42) of the substrate (14), and depositing the particles (12) onto the adhesive areas (30) on the contact pads (42), thereby attaching the particles (12) to the substrate (14). The adhesive stamp (35) may comprise a stamp (20) having at least one projection (22) and an adhesive material applied thereon. The stamp (20) may be composed of silicon, silicone rubber or metal. The adhesive material may be composed of an adhesive polymer or an adhesive flux.

8 Claims, 4 Drawing Sheets

METHOD AND APPARATUS FOR ATTACHING PARTICLES TO A SUBSTRATE

TECHNICAL FIELD OF THE INVENTION

The present invention relates in general to the field of electronic device packaging and more particularly to a method and apparatus for attaching electrically conductive particles to a substrate.

BACKGROUND OF THE INVENTION

Without limiting the scope of the invention, its background is described in connection with electronic device packaging, as an example.

Modern electronic components utilize numerous integrated circuits. These integrated circuits are electrically connected to each other or to other electronic components. One method for connecting integrated circuits to electronic components utilizes an area array electronic package, such as a ball-grid array (BGA) package or a flip-chip package. The electrical connections between an integrated circuit packaged in an array package design and a printed circuit board (PCB) are typically composed of solder. Therefore, an important step in the interconnection of many electronic components is tie formation of solder balls in the area array electronic package.

Heretofore, in this field, solder balls have been typically formed utilizing one of four methods: (1) electroplating; (2) printing of solder paste through a stencil or mask; (3)evaporation; or (4) mechanical transfer of preformed solder balls. Electroplating, printing of solder paste through a stencil or mask, and evaporation techniques have been typically utilized for forming solder bumps on wafers and integrated circuits. On the other hand, BGA and chip-scale packages (CSP) have commonly utilized printing of solder paste and mechanical transfer of solder ball techniques.

Electroplating techniques are very well known in the art. In a typical stencil method, solder paste is applied on top of a stencil with milled apertures. A squeegee is moved across the top of the stencil to force the solder paste to go through the apertures to reach contact pads of the electronic package substrate. Conventional evaporation methods involve the use of a vacuum chuck to transfer preformed solder balls to the substrate.

Another method for transferring preformed solder balls utilizes formation of a pattern of dots onto a photoimageable coating laminated to an organic film. The pattern is formed by placing a photomask on the coating and then exposing the coating to a dose of ultraviolet radiation. For example, for an area array package design, the photomask will contain a mirror image of the contact pads design. The areas protected by the photomask design retain their adhesiveness while the unprotected areas exposed to the ultraviolet radiation lose their adhesiveness. The array of adhesive areas corresponds to the pattern of contact pads found on the substrate to receive the solder connections.

After the adhesive areas are formed, solder particles are loaded onto the surface of the film and attach to the adhesive areas. The excess solder particles that lie on the non-adhesive areas are removed. The populated film is then aligned and brought into contact with contact pads, which may be fluxed. A solder reflow is performed to transfer the solder particles from the adhesive areas to the contact pads of the substrate. Following the reflow cycle, the film is removed from the solder particles and discarded.

BRIEF DESCRIPTION OF THE DRAWINGS

For a more complete understanding of the features and advantages of the present invention, reference is now made to the detailed description of the invention along with the accompanying figures in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
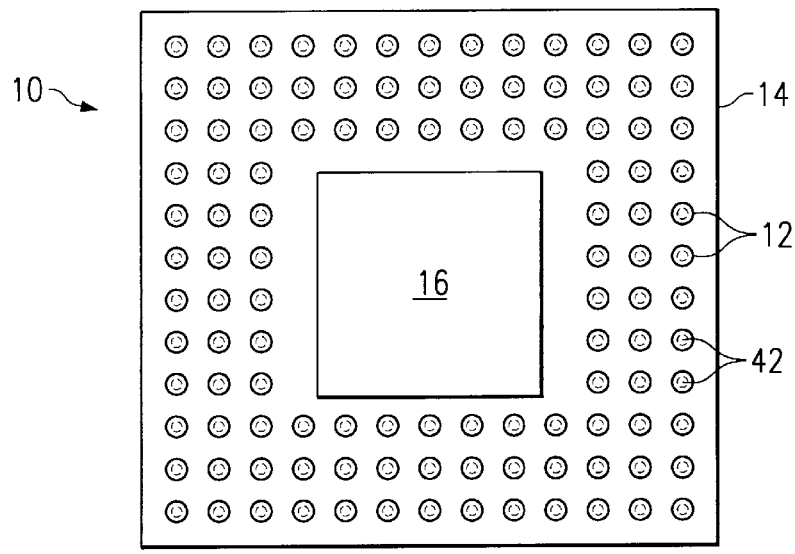
FIG. 1 is a plan view of a ball grid array package manufactured utilizing the principles of the present invention.

Reference is now made to FIG. 1, in which an exemplary ball grid array package is shown and generally designated as 10. Solder particles 12 are typically attached to contact pads 42 of substrate 14. Ball grid array package 10 is torment with an integrated circuit receiving area 16 for placement of an integrated circuit.

Solder particles 12 are generally discrete, freeflowing particles, and may have a variety of compositions. For example, solder particles 12 may be composed of solder alloys including combinations of tin, lead, silver, bismuth, copper, indium, antimony, and cadmiuim; however, it should be apparent to one skillets in the art that other suitable particles may be used including any of the above metals or other metals in the pure state, or conductive compounds, including plastic.

Solder particles 12 are typically solder spheres having a diameter in a range of approximately 3 mils to approximately 30 mils; however, it should be appreciated by persons skilled in the art that the principles of the present invention are applicable to solder particles 12 of other dimensions and configurations, such as rectangular or cylindrical columns.

Also, solder particles 12 may be attached directly to other substrates, such as an interposer or an integrated circuit in a flip-chip package. Electronic substrates or interposers consist of an insulating material having electrically conductive paths extending through the interposer from the surface to the opposite surface forming electrical entry and exit paths.

Ball grid array package 10 may be a conventional ball grid array package. Examples of conventional ball grid array substrate materials include organic laminates, ceramics, metals, and polymeric sheets and films. Ball grid array package 10 may also be any suitable substrate to which solder particles may be attached to facilitate electrical connection of electronic devices.

Figure 2A:
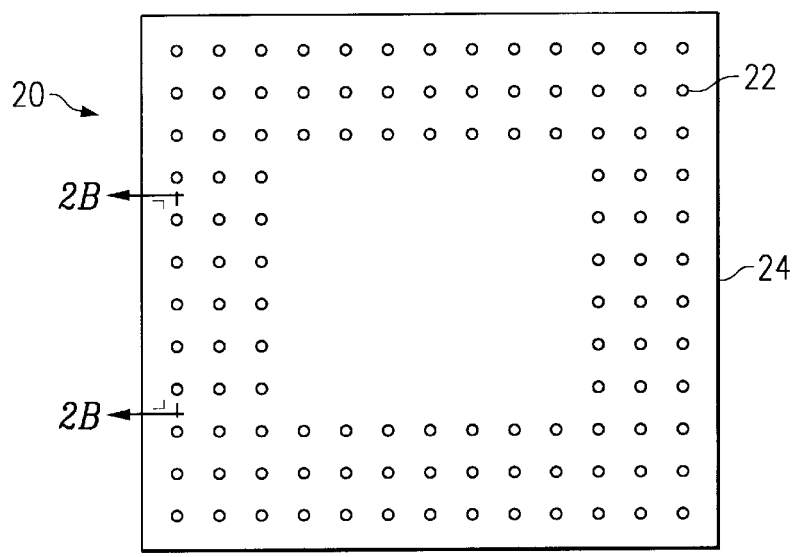
FIG. 2A is a plan view of a stamp for use in the present invention.
Figure 2B:
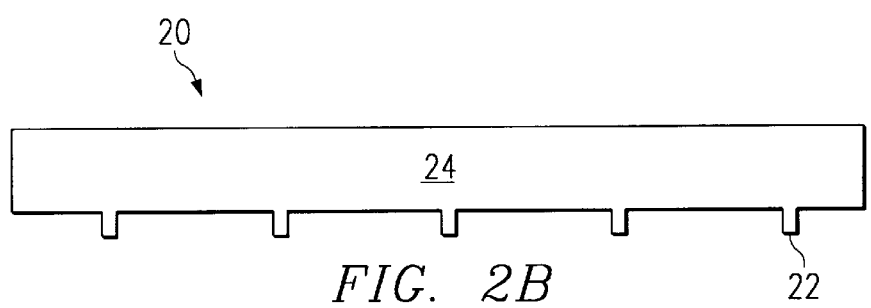
FIG. 2B is a cross-sectional view along line 2B—2B of the stamp of FIG. 2A.

Reference is now made to FIG. 2A, which depicts a plan view of a stamp generally denoted as 20 for use in the present invention. FIG. 2B shows a cross-sectional view taken along line 2B—2B of stamp 20 in FIG. 2A. In one embodiment of the invention, stamp 20 comprises at least one projection 22 which extends from structure 24. The pattern of projections 22 corresponds to the pattern of contact pads on the substrate to which solder particles 12 will be attached.

The diameter of projections 22 is typically approximately half of the diameter of solder particles 12; however, it should be appreciated by one skilled in the art that the principles of the present invention are applicable to projections 22 of other dimensions. Furthermore, although depicted as columns having circular tips in FIGS. 2A and 2B, projections 22 may have a variety of geometric configurations, such as oval or rectangular columns, for example, generally depending upon the geometric configuration of the contact pads, which may be circular, oval, square, rectangular, or other shape.

Stamp 20 may have a variety of configurations and compositions. Stamp 20 may be composed of any material suitable for holding a fine tolerance on a very fine pitch, such as in the range of 40–75 microns.

Stamp 20 may be mace from a silicone rubber material which is molded by a cast hat is patterned according to the contact pads design and then leveled such that the surface of each of the projections 22 lies in the same plane. Alternatively, stamp 20 many be composed of a metallic substance and may undergo an electronic discharge machining (EDM) process or etching process, in which the metal is etched away, resulting in the formation of projections 22. Furthermore, an orientation dependent etched (ODE) silicon wafer may be used for stamp 20, in which an oxide is deposited on the surface of the silicon, a photoresist is patterned on the silicon, and the oxides and silicon are etched to form projections 22. An advantage to a silicon stamp 20 when used in conjunction with a silicon substrate is that they have common coefficients of thermal expansion.

Figure 3A:
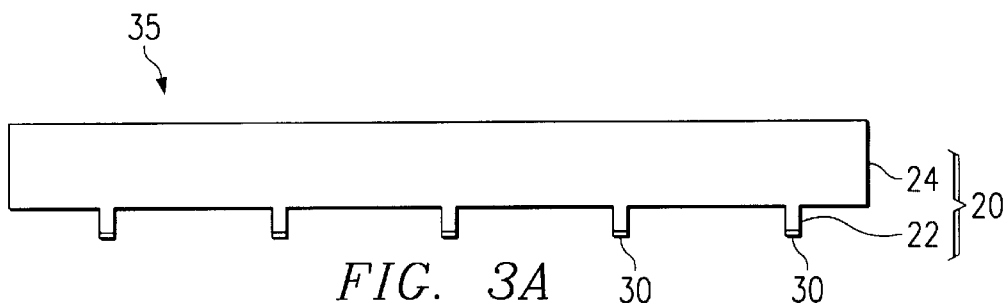
FIG. 3A is a cross-sectional view of an adhesive stamp in accordance with the present invention.

Reference is now made to FIG. 3A in which a cross-sectional view of an adhesive stamp 35 is shown. In accordance with the present invention, a plurality of adhesive areas 30 is formed on adhesive stamp 35 by depositing an adhesive material on the ends of projections 22. For example, projections 22 may be deposited into a reservoir of adhesive flux which promotes solder reflow to the under bump metallugy (UBM).

Figure 3B:
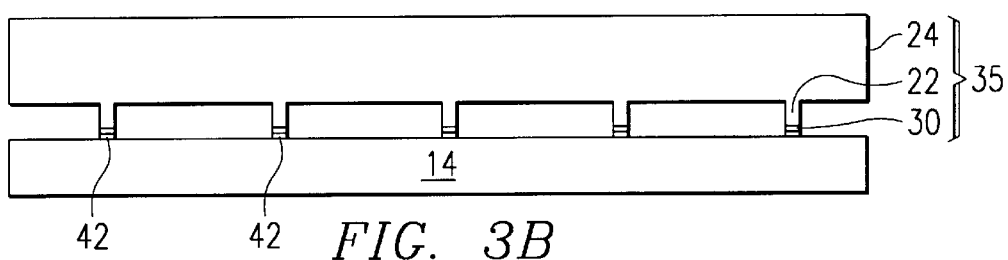
FIG. 3B is cross-sectional view of an adhesive stamp in close aligned proximity with contact pads of a substrate in accordance with the present invention.

FIG. 3B depicts adhesive areas 30 of adhesive stamp 35 positioned in close aligned proximity with contact pads 42 of substrate 14 in accordance with the present invention. Substrate 14 may be used in a variety of integrated circuit packages, such as a ball grid array package, a flip-chip package, an interposer, or a silicon wafer. Although contact pads 14 may be flush with the surface of substrate 14, contact pads 42 are depicted as protruding above the surface of substrate 14 for clarity.

Precise alignment may be achieved mechanically or optically, utilizing a split optics system, for example. Following alignment, adhesive areas 30 come into contact with contact pads 42, thereby transferring at least a portion of the adhesive material from projections 22 to contact pads 42. For example, a vacuum chuck may be utilized to pull substrate 14 into uniform contact with adhesive stamp 35, thereby allowing transfer of the adhesive material.

Significant advantages over the prior art are obtained by utilization of adhesive stamp 35 for attaching solder particles 12 in accordance with the present invention. For example, adhesive stamp 35 eliminates the need for photolithography processes that require expensive photomasks and polyimide carriers, which are discarded after each use. The elimination of photoimaging processes and polyimide carriers also reduces the costs of manufacturing electronic device packages.

Figure 3C:
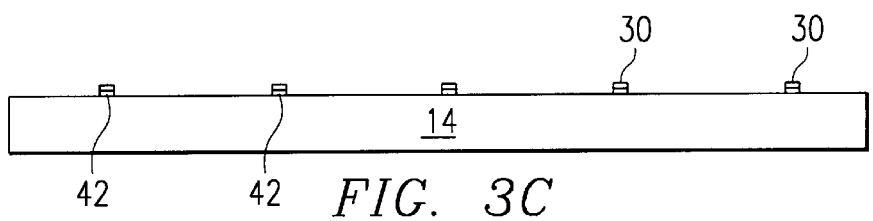
FIG. 3C is cross-sectional view of a substrate with adhesive material deposited onto contact pads of the substrate in accordance with the present invention.

FIG. 3C depicts substrate 14 having contact pads 42 with adhesive areas 30 deposited thereon. Adhesive areas 30 may be cured with application of thermal energy. The temperature required for curing depends upon the adhesive material used. Application of thermal energy increases the adhesive bond of adhesive areas 30, thereby improving the likelihood of each of adhesive areas 30 capturing and retaining one of solder particles 12. Such a configuration of attachment of one of solder particles 12 to each of adhesive areas 30 is generally termed 100% yield.

Thermal energy may be transferred from a variety of mechanisms, such as optical heating lamps (e.g. tungsten-halogen), a hot plate, a radiator, infrared heaters, or other similar devices. Thermal energy may be conductively, convectively or radiantly transferred to adhesive areas 30.

Figure 4:
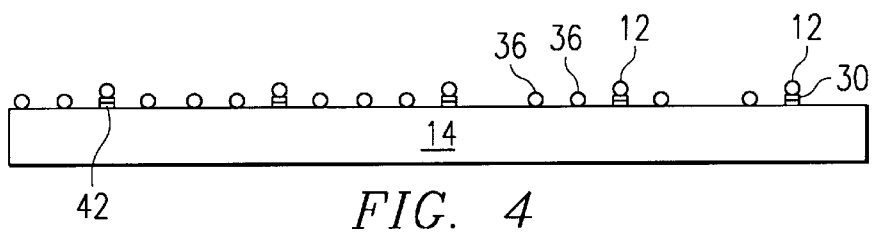
FIG. 4 is a cross-sectional view of a substrate with solder particles loaded thereon in accordance with the present invention.

A plurality of solder particles 12, including excess solder particles 36, may then be loaded, or deposited, onto the surface of substrate 14, as shown in FIG. 4. Solder particles 12 are captured and retained by adhesive areas 30 on contact pads 42, Excess solder particles 36 lie on non-adhesive portions of the surface of substrate 14 which have not been stamped with adhesive material.

Figure 5:
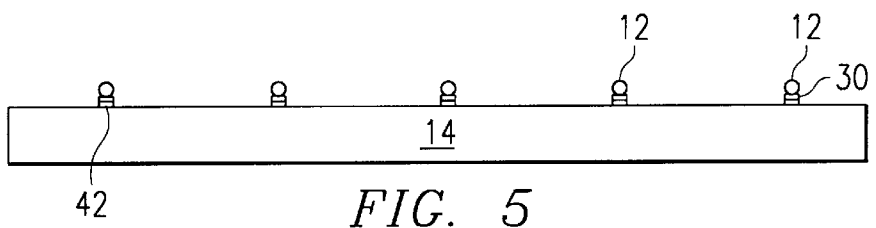
FIG. 5 is a cross-sectional view of a substrate with particles attached thereon in accordance with the present invention.

To ensure that each adhesive area 30 captures a solder particle 12, kinetic energy may be applied to forcibly spread solder particles 12 over the entire surface of substrate 14 onto adhesive areas 30. A gas stream or mechanical device may be used to distribute solder particles 12 and excess sadder particles 36 over the entire surface of substrate 14. Substrate 14 with solder particles 12 deposited thereon may be tilted or turned upside down to allow gravitational forces to remove excess solder particles 36. A mechanical device such as a vibrating pencil may also be utilized in the removal of excess particles 36. Following the distribution and removal steps, each of the solder particles 12 is attached to each of the adhesive areas 30 on each of the contact pads 42, as depicted in FIG. 5; all excess solder particles 36 have been removed, and none of solder particles 12 are clinging together.

Solder particles 12 used in the present invention may be securely attached to contact pads 42 using a variety of solder reflow systems, such as an optical heating reflow system, a vapor phase solder reflow system, or other solder reflow systems. In an optical heating reflow system, radiant heat from near infrared optical sources such as tungsten-halogen lamps may be utilized for rapid thermal ramping with minimal thermal inertia, thereby shortening cycle time.

The amount of heat supplied by the lamps is directly proportional to the supplied voltage. For example, higher voltage settings result in higher temperatures. Voltage input to the optical sources may be programmed to precisely match a prescribed temperature versus time profile. The heat from the infrared optical sources may uniformly heat substrate 14 with temperatures sufficient to melt solder particles 12 to form a metallurgical bond with contact pads 42.

With a vapor phase solder reflow system, vapor condenses to surround substrate 14 with a cloud of steam. A liquid, such as a nonchlorinated (non CFC) fluorocarbon is first heated with enough energy to form a vapor and to sustain a vapor cloud. When substrate 14 is then passed through the vapor, the vaporized liquid condenses thereon and gives off the latent heat of vaporization. This energy is then transferred to substrate 14. As long as substrate 14 remains in the vapor, the vapor continues to give off energy at a repeatable fixed rate and temperature, until substrate 14 reaches the temperature of the vapor.

Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the preferred temperatures of non-chlorinated fluorocarbons that are used as vapor fluids is shown below in conjunction with the composition of the solder type to be used. In one embodiment the composition of each of solder particles 12 is about 60% Pb (lead) and 40% Sn (tin), as this composition provides a strong adhesion between integrated circuit packages or an integrated circuit package and a board, such as a board, sisterboard or module board. Using the 60% Pb/40% Sn composition also dispenses with the need to provide solder paste on a solder pad, again due to the adhesion of the 60% Pb/40% Sn composition. Alternately, a variety of other materials may be used as solder particles 12, such as those described in the following chart. Solder particles 12 of the following compositions may be used with other solder reflow techniques.

| Vaporization Temperatures and Solder Types | |
| --- | --- |
| Liquidus Temperature | Solder Type |
| 56, 80, 97, 101, 102 C. and 155 C. | 100 In |
|  | 37 Sn/38 Pb/25 In |
| 165 C. | 70 Sn/18 Pn/12 In |
|  | 70 In/30 Pb |
| 174 C. | 60 In/40 Pb |
| 190 C. | 90 In/10 Ag |
|  | 50 In/50 Pb |
|  | 63 Sn/37 Pb |
|  | 70 Sn/30 Pb |
|  | 60 Sn/40 Pb |
| 215 C. and 230 C. | 60 Sn/40 In |
|  | 60 Sn/40 Pb |
|  | 63 /Sn/37 Pb |
|  | 70 Sn/30 Pb |
|  | 62 Sn/36 Pb/2 Ag |
| 240 C. and 253 C. | 75 Pb/25 In |
|  | 81 Pb/19 In |
| 260 C. and 265 C. | 96.5 Sn/3.5 Ag |

With an infrared or radiant heated solder reflow techniques, each component of the soldering system is directly exposed to radiation from a heating element. Heat from the radiant energy element is absorbed by the different components according to its molecular structure.

Figure 6:
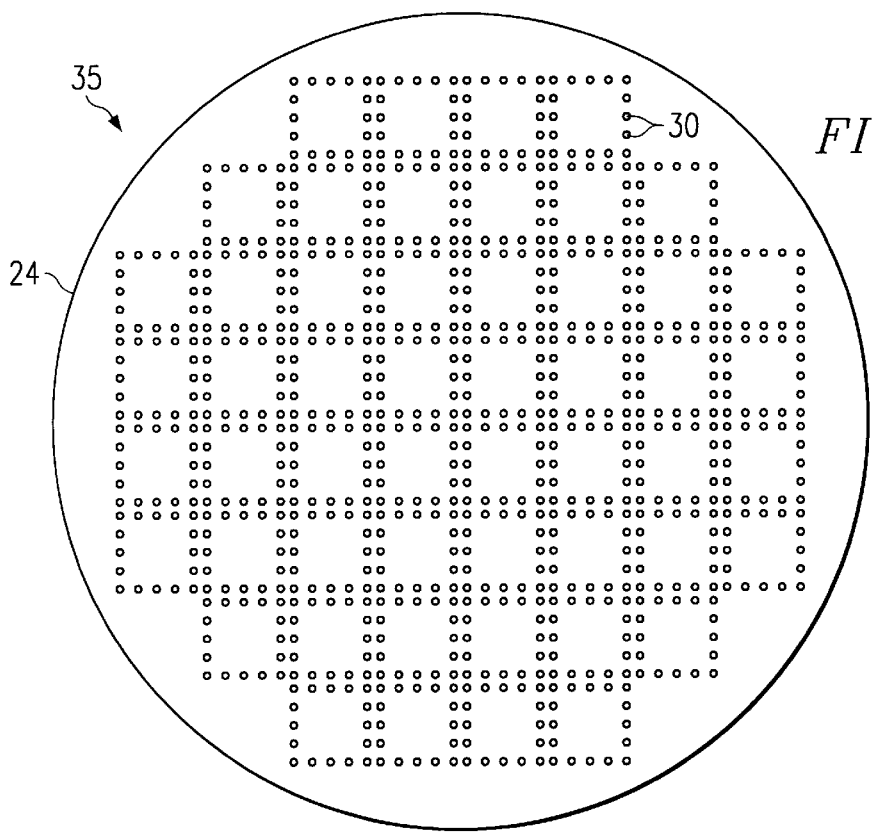
FIG. 6 is a plan view of a wafer-scale adhesive stamp in accordance with the present invention.

Reference is now made to FIG. 6, in which a plan view of a wafer-scale adhesive stamp in accordance with another embodiment of the present invention is depicted. The pattern of adhesive areas 30 of adhesive stamp 35 corresponds with the pattern of contact pads of a silicon wafer substrate. Adhesive stamp 35 of FIG. 6 is thus suitably proportioned for transfer of adhesive areas 30 to contact pads 42 of a silicon wafer 44, as shown in FIG. 7.

Figure 7:
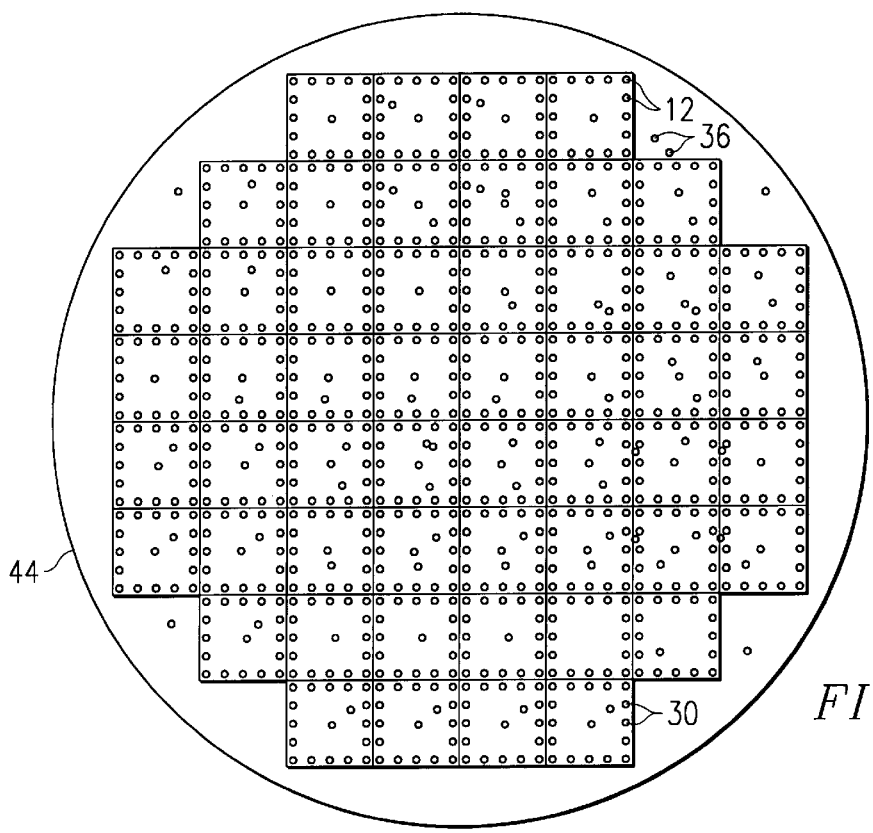
FIG. 7 is a plan view of a wafer with solder particles loaded thereon in accordance with the present invention.
Figure 8:
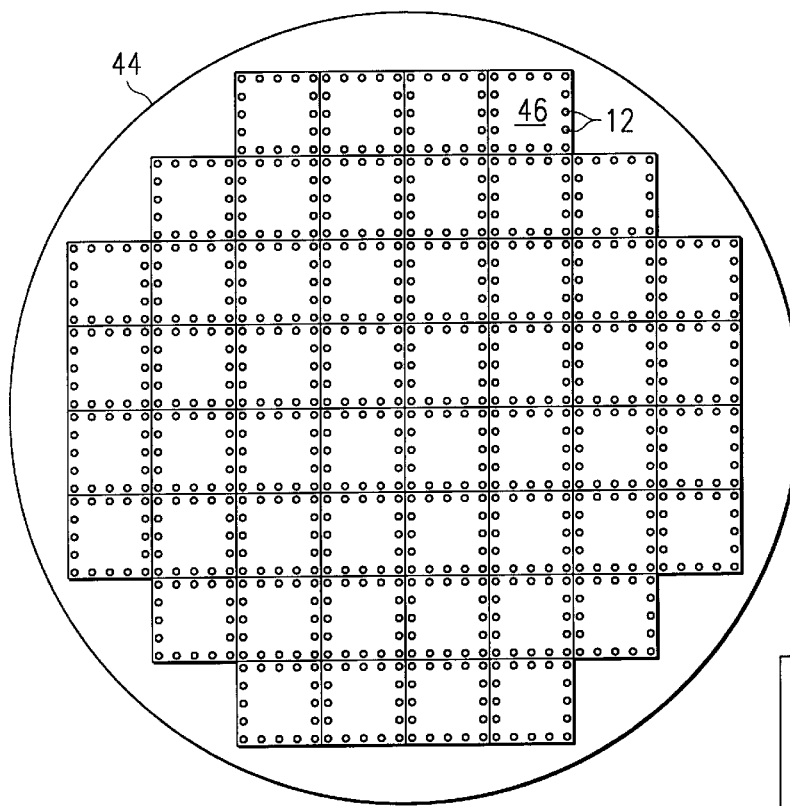
FIG. 8 is a plan view of a wafer with solder particles attached thereto in accordance with the present invention.

FIG. 7 depicts a plan view of wafer 44 with solder particles 12, including excess solder particles 36, deposited thereon. Following distribution and removal steps as described with reference to FIG. 4, each contact pad 42 of silicon wafer 44 has a solder particle 12 attached thereto as depicted in FIG. 8. Individual dies 46 of silicon wafer 44 are then ready for electrical connection to other substrates, such as printed circuit boards which may be incorporated into electronic devices.

Conventional methods of attaching solder particles 12 to substrates often result in missing solder particles. Such products result in open circuitry, and may likely render the electronic devices in which they were intended to be used non-functional. Therefore, in addition to chip-scale and wafer-scale attachment, the present invention further provides for an adhesive stamp 35 that may be utilized to transfer adhesive material to a specific contact pad on a pre-probed chip or wafer, for example. The present invention therefore enhances production efficiency and yield by allowing for correction of missing electrical connections. Furthermore, the present invention provides savings in the costs of solder particles 12 that would otherwise be wasted on non-functional chips.

Figure 9:
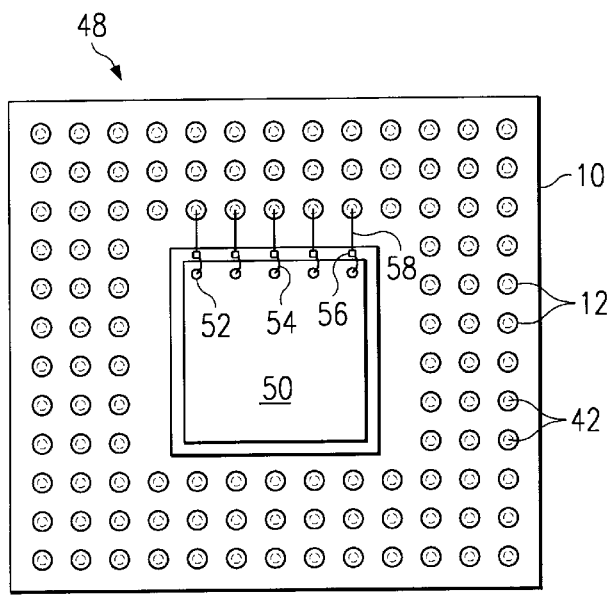
FIG. 9 is a plan view of an integrated circuit package utilizing the principles of the present invention.

Reference is now made to FIG. 9, which depicts a plan view of an exemplary integrated circuit package 48 utilizing an attachment-ready ball grid array package 10 in accordance with the present invention. Integrated circuit package 48 comprises ball grid array package 10 with an integrated circuit 50 attached thereto. Bond pads 52 are electrically connected via wire bonds 54 to pads 56 on ball (grid array package 10. Pads 56 are electrically connected to contact pads 42 via electrically conductive interconnect lines 58. Interconnect lines 58 may be patterned in one or more layers, with some of the interconnect lines 58 placed below the surface of ball grid array package 10. To protect the integrated circuit from the potentially corrosive nature of the atmosphere, the region surrounding integrated circuit 50, wire bonds 54, and pads 56 may he filled with polymeric material. Therefore, the formation of solder particles 12 on contact pads 42 facilitates electrical connection between integrated circuit 50 and another component, such as a printed circuit board.

Figure 10:
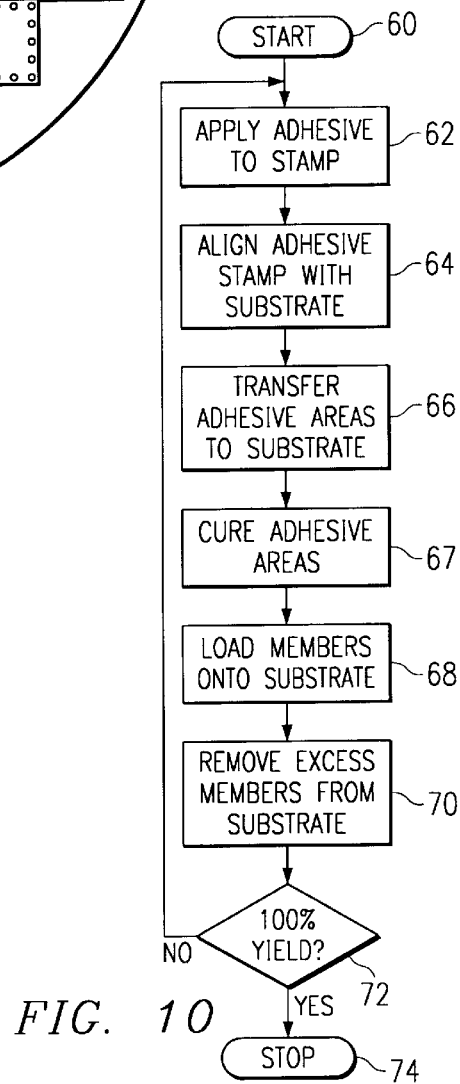
FIG. 10 is a process flow diagram for a method of attaching particles to a substrate in accordance with the present invention.

FIG. 10 is a process flow chart for attaching solder particles 12 to a substrate 14. The method begins in step 60. According to the principles of the present invention, in step 62, an adhesive material is applied to stamp 20, resulting in an adhesive stamp 35, having a plurality of adhesive areas 30 attached to a plurality of projections 22, as described with reference to FIGS. 2A–3A. In step 64, adhesive areas 30 of adhesive stamp 35 are aligned with contact pads 42 of substrate 14, as described with reference to FIG. 3B. In step 66, adhesive areas 30 are transferred to contact pads 42 of substrate 14.

Next, in step 68, a plurality of solder particles 12 including excess solder particles 36 are loaded onto the surface of substrate 14, as described with reference to FIG. 4. In step 70, excess solder particles 36 are removed from substrate 14, by application of kinetic energy, for example, as described with reference to FIG. 5. If 100% yield is not achieved in decision 72, steps 62, 64, 66, 68, and 70 may be repeated utilizing adhesive stamp 35 for individual sites; otherwise, if 100% yield is achieved, process flow ends at step 74.

While FIG. 10 has been described with reference to solder particles 12, it should he understood by one skilled

SUMMARY OF THE INVENTION

In order to produce a functional electronic device, it is preferable that the loading of the solder balls results in 100% population. It has been discovered, however, that loading of solder balls is adversely affected by many factors. For example, generation of electrostatic charges through the effects of tribocharging has often resulted in increased numbers of excess solder balls residing on the surface and clinging together in groups. Tribocharging is the ionic charging of particles resulting from moving them in the air. Without extensive ionizing equipment, it has been difficult to remove the excess solder balls or to break up the groups. Tribocharging is also affected by the relative humidity of the surrounding air.

Moreover, the surface texture and contamination of solder balls halve had an adverse effect on the attachment of solder balls to the adhesive areas. For example, solder balls with surface oxides have been more apt to collect electrostatic charges than oxide-free solder balls.

Furthermore, the adhesiveness of the adhesive areas has affected the ability of the adhesive areas to capture and retain solder balls. Areas with insufficient adhesiveness have often failed to capture or retain solder balls, even following repeated attempts. Such a failure to attach a solder particle to each adhesive area may result in the failure of the electronic device.

Electroplating techniques in the prior art suffer from many disadvantages. For example, they are generally inefficient, as the solder requires time to grow, and may take approximately an hour to grow per wafer. Furthermore, electroplating often results in non-uniform or misshapen solder bumps, or bumps that do not have enough solder to reach the same level of additional bumps. There are also problems with contamination and varying stoichiometry in the chemical bath.

Stenciling methods have led to a variety of problems. For example, the solder paste often becomes trapped in the apertures, and may block the passageways entirely. This has required frequent cleaning, which is also time consuming and labor-intensive. In addition, forcing the paste through the stencil may require forces that may damage the electronic package. Furthermore, it is difficult to achieve solder balls of precisely the desired size. Also, the use of solder paste may be more expensive than the use of solder balls. The stencils themselves are often expensing, to make, as they may require use of lasers for creating apertures on the order of 1 mm, as well as for ensuring planarity of the stencil Evaporation techniques also suffer from several disadvantages. For example, the minimum distance between solder balls allowable by these techniques may be unacceptable for some electronic device packages. Furthermore, solder often collects on the evaporation mask, which requires frequent cleaning. Finally, the slow rate of evaporation may be a factor contributing to inefficiency by lengthening cycle time.

Therefore, a need has arisen for a method and an apparatus for attaching solder balls to a substrate that overcomes the disadvantages of the prior art.

The present invention disclosed herein comprises a method for attaching a particle to a substrate, including the steps of transferring adhesive material from an adhesive stamp to a contact pad of the substrate, and depositing the particle onto the contact pad stamped with adhesive material, thereby attaching the particle to the substrate.

The present invention may also comprise an apparatus for transferring an adhesive to a substrate, including a structure having projections and an adhesive area attached to each projection. in the art that the principles of the present invention are applicable to particles of a variety of compositions, such as minerals and synthetic compounds including plastic, for example.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for attaching a particle to a substrate, comprising the steps of:

transferring adhesive material from an adhesive stamp to a contact pad of the substrate; and loading the particle onto the contact pad having adhesive material deposited thereon, thereby attaching the particle to the substrate.

2. The method as recited in claim 1, wherein the particle is composed of solder alloy.

3. The method as recited in claim 1, further comprising the additional step of applying thermal energy to said adhesive material after it is transferred to said contact pad.

4. The method as recited in claim 1, further comprising the additional step of reflowing the particle after it is attached, to more securely attach said particle to the contact pad.

5. The method as recited in claim 1, further comprising the step of removing excess particles from the substrate.

6. A method for attaching solder particles to a substrate, comprising the steps of:

obtaining an adhesive stamp having a plurality of adhesive areas;

aligning said plurality of adhesive areas with contact pads of the substrate;

transferring said plurality of adhesive areas to said contact pads;

applying thermal energy to said plurality of adhesive areas;

depositing the solder particles onto the substrate, whereby each adhesive area captures one particle;

then removing the excess solder particles not captured by said adhesive; and then securely attaching the captured solder particles to said contact pads.

7. The method as recited in claim 6 wherein the step of securely attaching the solder particles comprises reflowing the solder particles.

8. An integrated circuit package produced by the method of claim 6.

* * * * *

UNITED STATES PATENT AND TRADEMARK OFFICE
CERTIFICATE OF CORRECTION

PATENT NO. : 6,080,650
DATED : June 27, 2000
INVENTOR(S) : Darvin R. Edwards

It is certified that error appears in the above-indentified patent and that said Letters Patent is hereby corrected as shown below:

Cover Page, insert Item [60] under Related U.S. Application Data

--Provisional Application No. 60/073,625 Feb. 4, 1998.--

Signed and Sealed this

Third Day of April, 2001

Attest:

NICHOLAS P. GODICI

*Attesting Officer*     *Acting Director of the United States Patent and Trademark Office*